United States Patent
Konishi et al.

(10) Patent No.: US 11,876,014 B2
(45) Date of Patent: Jan. 16, 2024

(54) METHOD OF TRANSFERRING DEVICE LAYER TO TRANSFER SUBSTRATE AND HIGHLY THERMAL CONDUCTIVE SUBSTRATE

(71) Applicant: SHIN-ETSU CHEMICAL CO., LTD., Tokyo (JP)

(72) Inventors: Shigeru Konishi, Gunma (JP); Yoshihiro Kubota, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 338 days.

(21) Appl. No.: 17/349,159

(22) Filed: Jun. 16, 2021

(65) Prior Publication Data

US 2021/0335658 A1  Oct. 28, 2021

Related U.S. Application Data

(62) Division of application No. 16/346,176, filed as application No. PCT/JP2017/037143 on Oct. 13, 2017, now Pat. No. 11,069,560.

(30) Foreign Application Priority Data

Nov. 1, 2016 (JP) ................................ 2016-214492

(51) Int. Cl.
   *H01L 21/762* (2006.01)
   *H01L 21/683* (2006.01)

(52) U.S. Cl.
   CPC .... *H01L 21/76251* (2013.01); *H01L 21/6835* (2013.01); *H01L 2221/6839* (2013.01)

(58) Field of Classification Search
   CPC .......... H01L 21/76251; H01L 21/6835; H01L 2221/6839; H01L 21/02021; H01L 27/1203; H01L 29/66772; H01L 21/2007; H01L 21/76256
   USPC ........................................................ 257/506
   See application file for complete search history.

(56) References Cited

U.S. PATENT DOCUMENTS

| 4,141,926 | A | | 2/1979 | Ariga et al. |
| 5,804,090 | A | | 9/1998 | Iwasaki et al. |
| 5,937,312 | A | * | 8/1999 | Iyer ..................... H01L 21/3226 438/455 |

(Continued)

FOREIGN PATENT DOCUMENTS

| JP | 3-11666 | 1/1991 |
| JP | 2007-088235 | 4/2007 |

(Continued)

OTHER PUBLICATIONS

ISR issued in WIPO Patent Application No. PCT/JP2017/037143, dated Jan. 9, 2017, English translation.

(Continued)

*Primary Examiner* — Vu A Vu
(74) *Attorney, Agent, or Firm* — GREENBLUM & BERNSTEIN, P.L.C.

(57) ABSTRACT

A highly thermal conductive substrate formed by bonding a device layer formed on a silicon on insulator (SOI) wafer and a buried oxide film to an insulator substrate having a thermal conductivity of 40 W/m·K or more via a low-stress adhesive, wherein a thickness of the buried oxide film is 50 to 500 nm and a thickness of the adhesive is 0.1 to 10 μm.

2 Claims, 1 Drawing Sheet

(56) References Cited

U.S. PATENT DOCUMENTS

| | | | |
|---|---|---|---|
| 6,498,073 B2 * | 12/2002 | Sarma | H01L 27/1464 438/149 |
| 6,797,632 B1 | 9/2004 | Nakano et al. | |
| 7,148,119 B1 * | 12/2006 | Sakaguchi | H01L 21/6835 438/409 |
| 7,288,428 B2 | 10/2007 | Muramatsu | |
| 7,312,487 B2 * | 12/2007 | Alam | H01L 21/84 438/455 |
| 8,314,007 B2 * | 11/2012 | Vaufredaz | H01L 21/76256 438/455 |
| 8,921,209 B2 * | 12/2014 | Bedell | H01L 21/76254 438/480 |
| 8,927,318 B2 * | 1/2015 | Bedell | H01L 21/0262 136/256 |
| 9,425,248 B2 | 8/2016 | Konishi et al. | |
| 10,831,043 B2 * | 11/2020 | Yu | G02F 1/017 |
| 10,847,370 B2 * | 11/2020 | Allibert | H01L 21/2255 |
| 2004/0061232 A1 | 4/2004 | Shah et al. | |
| 2007/0164260 A1 | 7/2007 | Kuwajima | |
| 2009/0298388 A1 | 12/2009 | Li et al. | |
| 2010/0159671 A1 | 6/2010 | Keyser | |
| 2011/0151644 A1 | 6/2011 | Vaufredaz | |
| 2012/0119224 A1 | 5/2012 | Tai et al. | |
| 2013/0294038 A1 | 11/2013 | Landru et al. | |
| 2015/0130015 A1 | 5/2015 | Motoyama et al. | |
| 2016/0141220 A1 | 5/2016 | Watanabe | |
| 2016/0163463 A1 | 6/2016 | Namikawa et al. | |
| 2016/0293759 A1 | 10/2016 | Motoyama et al. | |
| 2017/0069586 A1 | 3/2017 | Motoyama et al. | |

FOREIGN PATENT DOCUMENTS

| | | |
|---|---|---|
| JP | 4389626 | 12/2009 |
| JP | 2012-124473 | 6/2012 |
| JP | 2013-543276 | 11/2013 |
| JP | 2013-251430 | 12/2013 |
| JP | 2014-093504 | 5/2014 |
| JP | 2015-032797 | 2/2015 |
| JP | 2016-103635 | 6/2016 |
| JP | 2016-111182 | 6/2016 |
| JP | 5928481 | 6/2016 |
| WO | 2016/052597 | 4/2016 |

OTHER PUBLICATIONS

IPRP issued in WIPO Patent Application No. PCT/JP2017/037143, dated Jan. 9, 2017, English translation.

"3D LSI Integration Technology", FUJITSU 62,5, p. 601-607 (Sep. 2011).

JP Office Action issued in JP Patent Application No. 2018-548604 dated Apr. 14, 2020, English translation.

* cited by examiner

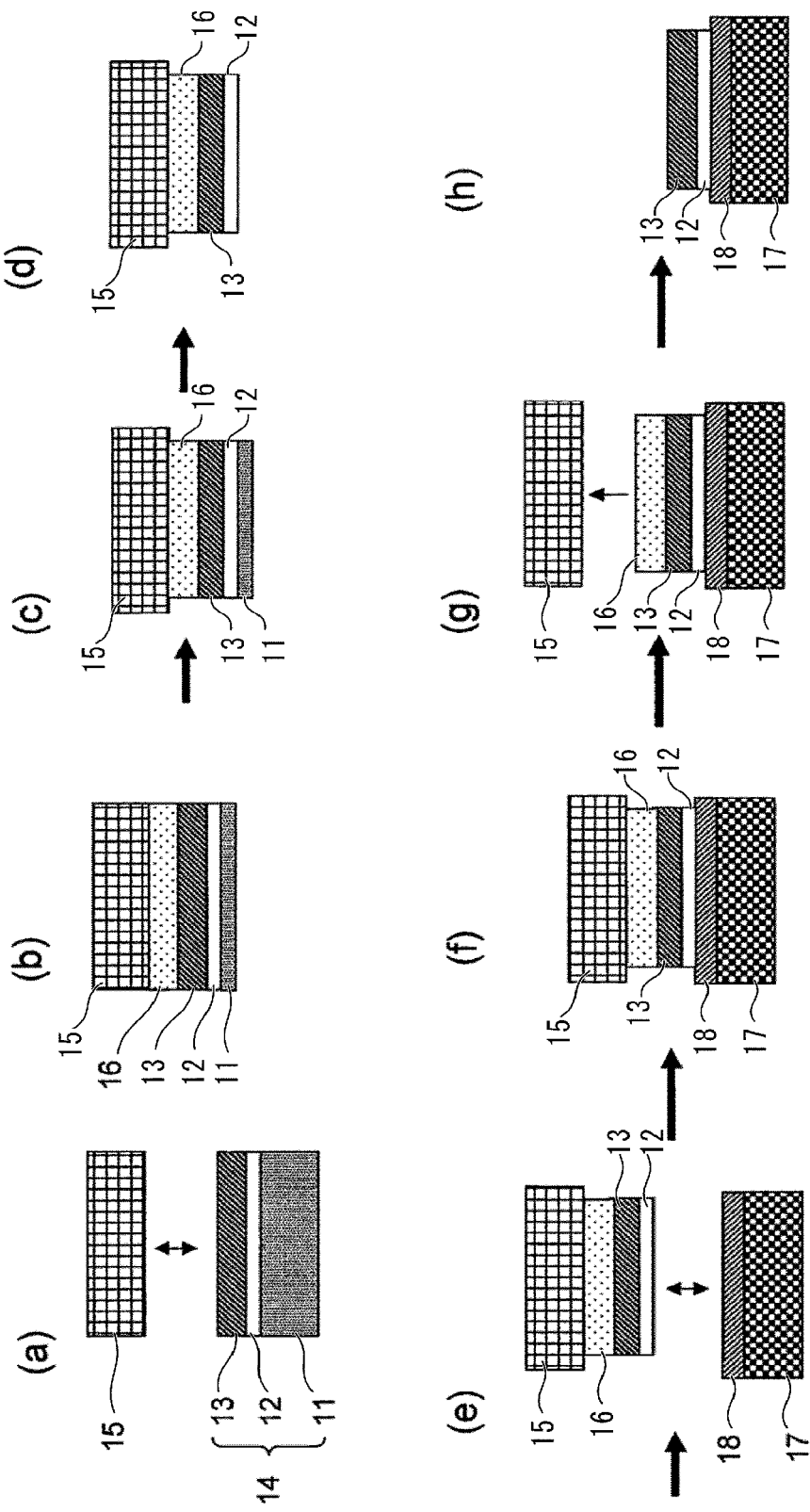

METHOD OF TRANSFERRING DEVICE LAYER TO TRANSFER SUBSTRATE AND HIGHLY THERMAL CONDUCTIVE SUBSTRATE This application is a Divisional of U.S. patent application Ser. No. 16/346,176, filed Apr. 30, 2019, which is a National Stage Entry of International Patent Application No. PCT/JP2017/037143, filed Oct. 13, 2017, which claims the benefit of Japanese Patent Application No. 2016-214492, filed Nov. 1, 2016. The disclosure of each of these documents, including the specification, drawings, and claims, is incorporated herein by reference in its entirety.

TECHNICAL FIELD

The present invention relates to a method of manufacturing an insulator substrate exhibiting high thermal conductivity, for example, a substrate in which a semiconductor device layer is formed on the surface of a sintered body such as silicon nitride and which exhibits high heat dissipation property and small loss at a high frequency and a structure of the substrate.

BACKGROUND ART

In recent years, the performance of silicon-based semiconductor devices has increased more and more with miniaturization of design rules. However, heat dissipation from individual transistors and metal wirings connecting transistors to each other has been a problem. In order to deal with this problem, it has also appeared that the back surface of silicon is thinned to about 100 to several hundreds of μm after fabrication of the device and a huge fan is attached on the chip to prompt heat dissipation and the device is cooled by being surrounded with a water cooled tube.

However, even if silicon is thinned, the region in which the device is fabricated is in about several μm from the surface, regions other than this act as heat pools, and it cannot be thus said that the efficiency is favorable from the viewpoint of heat dissipation. In recent years, silicon on insulator (SOI) wafers and the like to be used in high-performance processors and the like have a structure in which an insulating layer formed of $SiO_2$ is interposed immediately under the device layer, but the thermal conductivity of $SiO_2$ is as low as 1.38 W/m·K, and this is a problem from the viewpoint of heat dissipation. Furthermore, the loss of silicon substrate in a high frequency region is great because of the relation of dielectric characteristics, and thus use of the silicon substrate in a high frequency region has been limited.

Silicon-on-sapphire using a sapphire substrate has characteristics that the thermal conductivity is favorable and the loss in a high frequency region is small and thus attracts attention but has the following problems. In other words, a sapphire substrate is transparent in the visible light region, and there is thus a problem that the sapphire substrate is not responsive to the photosensor to be used for confirming the presence or absence of a substrate in the cassette and for positioning the wafer in the device manufacturing process. In addition, there is a problem that a sapphire substrate having an diameter of 150 mm or 200 mm is expensive.

In view of the above problems, as a substrate which is opaque to visible light, exhibits favorable thermal conductivity, and is inexpensive, a ceramic sintered body such as silicon nitride or aluminum nitride can be mentioned. Substrates in which a single crystal silicon film is formed on substrates of these ceramic sintered bodies have been developed (see, for example, Patent Document 1 and Patent Document 2). These ceramic sintered bodies are formed by solidifying a powder of silicon nitride or aluminum nitride with a sintering aid. For this reason, the ceramic sintered bodies contain metals such as iron (Fe) and aluminum (Al) contained in the powder and sintering aids such as alumina as impurities.

In order to prevent diffusion of these impurities during the device manufacturing process, a diffusion preventing layer is provided. However, depending on the device manufacturing process, there is a problem that metal impurities diffuse depending on the treatment temperature and cycle and the influence thereof on device characteristics and the contamination of manufacturing apparatus therewith are concerned despite the presence of diffusion preventing layer.

In addition, as a technique for bonding a substrate on which a device is fabricated and a transparent supporting substrate to each other, for example, a technique for bonding a SOI device wafer with a transparent supporting substrate to each other via an adhesive and thinning the back surface of SOI is disclosed in the case of a back-illuminated CMOS wafer (see, for example, Patent Document 3). In this bonding method, the front side of the device layer and the transparent substrate are bonded to each other. In other words, the device layer formed on the original SOI wafer is inverted and bonded. In this case, wiring processing for electrical connection is required after transfer of the device layer.

In addition, it has been investigated that the thickness of the wafer when stacking extremely thin device wafers is decreased to about 10 μm except the device layer and it is supposed that the wafer is thinned by grinding and CMP (see, for example, Non Patent Document 1). However, in order to further propose the loss in a high frequency region, it is desirable to completely remove the Si wafer portion below the buried oxide film and it cannot be said that thinning by grinding and chemical mechanical polishing (CMP) which leave machining marks is preferable.

PRIOR ART REFERENCES

Patent Document

Patent Document 1: JP 5928481 B1
Patent Document 2: WO2016/052597 A
Patent Document 3: JP 4389626 B1

Non Patent Document

Non Patent Document 1: Kitada et al., "Three-Dimensional LSI Integration Technology", FUJITSU. 62 (5), p. 601-607 (2011)

SUMMARY OF THE INVENTION

Problems to be Solved by the Invention

The present invention has been made in view of the above circumstances, and an object thereof is to provide a method of manufacturing a substrate which does not require a high-temperature process to cause diffusion of metal impurities and exhibits excellent heat dissipation property and small loss with respect to a high frequency and a highly thermal conductive substrate.

Means for Solving the Problems

The inventors of the present invention have conducted intensive investigations to solve the above problems, and as a result, have found out that peeling off of the wafer from the supporting substrate does not occur when thinning the SOI wafer to obtain a thinned device wafer as a silicone resin exhibiting excellent acid resistance is used as an adhesive for temporary bonding in a transfer method in which a device layer in an SOI wafer obtained by stacking a silicon (Si) layer, a buried oxide film which is an insulator layer, and a device layer is transferred to a transfer substrate which is an insulating substrate exhibiting high thermal conductivity and which includes the following steps (a) to (g).

In other words, the method of transferring a device layer to a transfer substrate of the present invention is a method of transferring a device layer in a silicon on insulator (SOI) wafer obtained by stacking a silicon (Si) layer, an insulator layer, and the device layer to a transfer substrate, which includes a step of temporarily bonding a surface on which the device layer is formed of the SOI wafer to a supporting substrate using an adhesive for temporary bonding, a step of removing the Si layer of the SOI wafer until the insulator layer is exposed and obtaining a thinned device wafer, a step of coating only the transfer substrate with an adhesive for transfer and then bonding the insulator layer in the thinned device wafer to the transfer substrate via the adhesive for transfer, a step of thermally curing the adhesive for transfer under a load at the same time as or after bonding, a step of peeling off the supporting substrate, and a step of removing the adhesive for temporary bonding remaining on a surface of the device layer after peeling off.

When a wafer is thinned until the insulator layer (for example, a buried oxide film) is exposed, a level difference having a height of 1 to 10 nm due to the device wiring pattern is generated. In the present invention, when bonding the surface having this level difference to a transfer substrate which is an insulator via an adhesive for transfer, the device layer can be uniformly transferred without generating voids at the bonding interface by applying and baking the adhesive for transfer on the transfer substrate side and thermally curing the adhesive for transfer under a load. Incidentally, it is not preferable that the adhesive for transfer is applied on the thinned device side and baked since there is a case in which deformation of the resin component in the adhesive for temporary bonding occurs.

It is preferable that the step of removing the Si layer includes a step of grinding and thinning the Si layer, a step of edge trimming a SOI wafer temporarily bonded to the supporting substrate and an adhesive for temporary bonding, and a step of removing the remaining Si layer by etching using an acid.

It is preferable that the adhesive for temporary bonding contains silicone which is resistant to a strong acid as a main component. It is also preferable that edge trimming is performed by tape polishing.

By performing the edge trimming to be performed in order to remove the adhesive for temporary bonding thickened at the wafer end portion (outer peripheral portion) through trimming by tape polishing, trimming can be performed without causing peeling off and cracking of the thin device layer from the supporting substrate.

It is preferable that a low-stress adhesive having a Young's modulus of 10 MPa to 2 GPa is used as an adhesive for transfer to be applied to the transfer substrate side and a thickness of the adhesive is 0.1 to 10 μm or less. In addition, it is preferable that a thermosetting epoxy-modified silicone is used as the adhesive for transfer. By using such an adhesive for transfer, it is possible to perform transfer with a low stress and excellent heat resistance. In addition, by setting the thickness of the adhesive for transfer to 0.1 to 10 μm, high thermal conductivity can be maintained.

It is preferable that a substrate selected from sapphire, alumina, an AlN sintered body, a $Si_3N_4$ sintered body, a SiC sintered body, a poly-SiC, or polycrystalline diamond is used as the transfer substrate.

As the insulator layer included in the SOI wafer, for example, a buried oxide film is used.

It is preferable that the supporting substrate is peeled off by, for example, a mechanical measure in the peeling off step.

In addition, the highly thermal conductive substrate according to the present invention is a substrate formed by bonding a device layer formed on a silicon on insulator (SOI) wafer and a buried oxide film to an insulator substrate having a thermal conductivity of 40 W/m·K or more via a low-stress adhesive, in which a thickness of the buried oxide film is 50 to 500 nm and a thickness of the adhesive is 0.1 to 10 μm.

In the highly thermal conductive substrate according to the present invention, it is preferable that the adhesive is a thermosetting epoxy-modified silicone. In addition, in the highly thermal conductive substrate according to the present invention, it is preferable that the insulator substrate is selected from sapphire, alumina, an AlN sintered body, a $Si_3N_4$ sintered body, a SiC sintered body, poly-SiC, or polycrystalline diamond.

BRIEF DESCRIPTION OF THE DRAWINGS

FIG. 1 is a diagram illustrating a process of a method of transferring a device layer to a transfer substrate.

DESCRIPTION OF EMBODIMENTS

In the method of transferring a device layer to a transfer substrate according to the present invention, the device layer in a SOI wafer obtained by stacking a silicon (Si) layer, a buried oxide film which is an insulator layer, and the device layer is transferred to a transfer substrate via an adhesive after the Si layer is removed. The present invention is a method of transferring a device layer without inverting the device layer, and thus the device layer can be transferred in a state in which the solder bumps are formed in the device layer of the SOI wafer and a process for forming an active portion such as electrical wiring formation is not required after the transfer.

In the present invention, a wafer temporarily bonding technique to be used when forming and three-dimensionally stacking ultra-thin chips is utilized in order to obtain a thinned device wafer by thinning the SOI wafer. In the present invention, it is intended to eliminate high frequency loss, and it is required to completely remove the Si layer below the buried oxide film, but thinning by grinding and CMP which have been conventionally used is not preferable since machining marks remain. In the present invention, wet etching using an acid is suitably used in the step of removing the Si layer until the buried oxide film is exposed after the wafer is thinned to a certain thickness by a conventional method. Wet etching is preferable from the viewpoint of rapidity of the etching rate. In a case in which etching is performed in a state in which the substrate thickness is decreased, it has been revealed that peeling off/erosion of the adhesive for temporary bonding occurs and a problem that creases are formed from the outer peripheral portion and the thinned device peels off arises when the acid resistance of the adhesive for temporary bonding is poor. In the present invention, it is intended to find out the facts that the maintained state of the thinned wafer largely varies depending on the adhesive for temporary bonding to be used, in association with this, peeling off occurs depending on the edge trimming method for removing the relatively thick adhesive for temporary bonding on the outer peripheral portion of the substrate, and bonding is affected by the surface to be coated with an adhesive for transfer when bonding the thinned device wafer with the transfer substrate using the adhesive for transfer in a case in which processing for thinning the wafer until the buried oxide film is exposed is performed and to clarify an appropriate method of transferring a device layer to a transfer substrate.

A process of the method of transferring a device layer to a transfer substrate of the present invention will be described with reference to the flow illustrated in FIG. 1.

First, a SOI wafer 14 on which a device is formed and a supporting substrate 15 are bonded to each other using an adhesive for temporary bonding 16 (FIG. 1(a)). The SOI wafer 14 has a Si layer 11, a buried oxide film 12, and a device layer 13. The thickness of the device layer 13 depends on the number of wirings as well but is usually 4 to 6 μm. Solder bumps may be formed on the surface of the device layer 13. As the supporting substrate 15 to be used, it is desirable to use a substrate having a linear expansion coefficient similar to that of Si and it is possible to use a Si wafer, Tempax, EAGLE-XG or the like although it depends on the method of curing the adhesive for temporary bonding 16 to be used as well. As the adhesive for temporary bonding 16, it is possible to use an adhesive containing thermosetting modified silicone as a main component such as WSS (UV curable acrylic adhesive) manufactured by 3M or TA1070T/TA2570V3/TA4070 manufactured by Shin-Etsu Chemical Co., Ltd. but it is preferable to use an adhesive containing the latter modified silicone exhibiting excellent acid/alkali resistance at the time of back surface etching as a main component as the adhesive for temporary bonding.

Subsequently, the Si layer 11 on the back surface of the SOI wafer 14 is thinned after temporary bonding (FIG. 1(b)). It is preferable to thin the Si layer 11 by grinding from the viewpoint of throughput, and it is preferable to thin the wafer by combining, for example, grindstones #600 to #2000. After grinding, for example, CMP and dry polishing may be performed to smooth the surface. In this step, it is preferable to leave the Si layer 11 by 10 to 100 μm and preferably 20 to 50 μm so that processing distortion does not reach even the device layer 13. The above range is suitable since it is concerned that the processing distortion reaches the device layer 13 when the remaining Si layer 11 is thinner than 10 μm and the etching time for removing the remaining Si layer 11 by wet etching increases when the remaining Si layer 11 is thicker than 100 μm.

After the Si layer 11 is sufficiently thinned, edge trimming is performed (FIG. 1(C)). The adhesive for temporary bonding 16 tends to be thicker at the outer peripheral portion of the SOI wafer than at the in-plane central portion. Hence, in this step, the outer peripheral portion of the SOI wafer 14 is removed so as to leave the part having a uniform thickness of the adhesive for temporary bonding 16. The trimming amount may be determined so as to sufficiently remove the residue of the adhesive for temporary bonding 16 and not to diminish the area of the device portion. Specifically, the part from the edge (edge) of the SOI wafer 14 to 2 to 5 mm is removed together with the adhesive for temporary bonding 16. Incidentally, the supporting substrate 15 is not coated with the adhesive for temporary bonding and may not be thus subjected to edge trimming. As the edge trimming method, there are grinding using a grinder and tape polishing using a polishing film. When grinding using a grinder is performed, the grindstone is clogged since the resin is tender and seize and peeling off of the substrate occur in a case in which modified silicone is used as the adhesive for temporary bonding 16 to be used. For this reason, it is preferable to perform edge trimming by tape polishing.

Subsequently to edge trimming, etching for completely removing the remaining Si layer 11 on the back surface is performed (FIG. 1(d)). The etching can be performed using an acid or an alkali. It is possible to etch Si by 20 μm at room temperature in several minutes in etching using an acid arbitrarily selected/mixed from strong acids such as HF, $HNO_3$, $CH_3COOH$, $H_2SO_4$, and $H_3PO_4$ while it takes 1 hour or more at 70° C. to etch Si by 20 μm in etching using an alkali such as KOH or $NH_4OH$. Etching using an acid is preferable from the viewpoint of etching rate. Etching is performed by immersion or spin etching of one surface, but spin etching on one surface is preferable from the viewpoint of suppressing etching of the supporting substrate 15. The layer of the adhesive for temporary bonding 16 is exposed at the end portion of the SOI wafer 14 as edge trimming is performed. When the adhesive for temporary bonding 16 to be used is not resistant to an acid, peeling off of the device layer 13 occurs since the adhesive for temporary bonding 16 is eroded from the end portion of the SOI wafer 14 by the etching solution. For example, in a case in which WSS that is manufactured by 3M and is not resistant to an acid is used as the adhesive for temporary bonding 16, erosion by the acid occurs and peeling off occurs from the end portion of the SOI wafer 14, and thus WSS is not suitable for use in the present invention. In contrast, in a case in which a modified silicone-based adhesive which is resistant to an acid is used as the adhesive for temporary bonding 16, peel off does not occur and etching can be performed until the buried oxide film 12 is exposed. The wafer which is obtained in this step and from which the Si layer 11 has been completely removed is referred to as a thinned device wafer.

Subsequently, an adhesive for transfer 18 is applied to the side of a transfer substrate 17 which is an insulator, and the transfer substrate 17 is bonded to the thinned device wafer (FIG. 1(e)). The buried oxide film 12 is exposed on the surface of the thinned device wafer from which the Si layer 11 has been removed. The buried oxide film 12 is usually 50 to 500 nm, but, when the Si layer 11 is completely removed, the buried oxide film 12 having the above thickness is deformed by the local stress caused by the pattern wiring of the device layer 13 and a level difference having a height of 1 to 10 nm is generated to correspond to the wiring pattern. The buried oxide film 12 cannot be bonded to the transfer substrate 17 by direct bonding or plasma bonding when there is such a level difference. Hence, bonding is performed via the adhesive for transfer 18 in order to bond the surface having the level difference to the transfer substrate 17. Usually, baking is performed at 100° C. to 200° C. for solvent removal when the adhesive for transfer 18 is applied. There is a case in which components of the adhesive substrate for temporary bonding 16 are deformed and lamellar irregularities are generated when the thinned device wafer from which the Si layer 11 has been removed is heated in the above temperature range. Hence, it is preferable that the adhesive for transfer 18 is applied on the transfer substrate 17 side. As the transfer substrate 17 to be used, one that has a high thermal conductivity and provides a wafer size of 200 to 300 mm p is preferable, and it is preferable to use sapphire, alumina, an AlN sintered body, a $Si_3N_4$ sintered body, a SiC sintered body, poly-SiC, polycrystalline diamond or the like. As the adhesive for transfer 18 to be applied, an adhesive is preferable which is resistant to the highest process temperature of 250° C. to 300° C. after formation of the device layer 13 and has a Young's modulus after curing of 10 MPa to 2 GPa in order to decrease the stress on the device layer 13 at the time of bonding. When the Young's modulus is smaller than 10 MPa, the Tg of the adhesive is low and heat resistance is not exerted. On the other hand, when the Young's modulus is larger than 2 GPa, there is a problem that the adhesive is hard and it is difficult to perform bonding. As an adhesive satisfying these requirements, it is preferable to use a silicone resin, epoxy-modified rubber, epoxy-modified silicone or the like, and particularly epoxy-modified silicone is most preferable from the viewpoint that the adhesive can be formed thin and the adhesive strength is maintained. The thermal conductivity of the adhesive itself is as small as about 1 W/m·K, and it is thus preferable to form a layer of the adhesive for transfer 18 as thin as possible and uniformly in order to fabricate a substrate having a high thermal conductivity. The heat dissipation property becomes ½ or less as compared with a case of not having the adhesive for transfer 18 when the thickness of the layer of the adhesive for transfer 18 exceeds 10 μm, and it is thus preferable to provide the layer of the adhesive for transfer 18 by 10 μm or less. In addition, it is difficult to uniformly apply the adhesive for transfer 18 in the plane and to bond the members each other when the thickness of the layer of the adhesive for transfer 18 is 0.1 μm or less. For this reason, the thickness of the layer of the adhesive for transfer 18 may be set to 0.1 to 10 μm and is set to preferably 0.1 to 2 μm and more preferably 0.1 to 1 μm. As a method of applying the adhesive for transfer 18, methods such as die coating, slit coating, dip coating, and spin coating can be used, but spin coating is preferable from the viewpoint that the adhesive for transfer 18 can be uniformly applied only on the bonding surface side.

Subsequently, the device layer 13 in the thinned device wafer and the transfer substrate 17 coated with the adhesive for transfer 18 are bonded to each other (FIG. 1(*f*)). It is preferable to heat the adhesive for transfer 18 applied to the transfer substrate 17 before bonding and thus to perform solvent removal and half curing in advance in order to prevent degassing due to heating at the time of bonding. The temperature range when performing heating before bonding is 100° C. to 200° C. and preferably 120° C. to 180° C. Subsequently to heating before bonding, the thinned device wafer from which the Si layer 11 has been removed and the transfer substrate 17 coated with the adhesive for transfer 18 are bonded each other so that the bonding surfaces thereof face each other. A load is applied to the members at the same time as or after the bonding on the left and heating is performed while holding the load to fully cure the adhesive for transfer 18, whereby the bonding strength is increased. The upper limit of the load to be applied may be a load by which deformation of the device layer 13, particularly the solder bump is not caused, and for example, it is less than 20 kgf/cm², preferably 10 kgf/cm² or less, and more preferably 5 kgf/cm² or less. It is preferable to apply a load of 1 kgf/cm² or more so that the members are superimposed one on another while correcting the warpage of 5 to 50 μm of the substrate itself. Incidentally, the thinned device wafer and the transfer substrate 17 may both have warpage of the substrate, but this warpage can be corrected by applying a load thereto at the time of bonding. It is preferable that the temperature to be raised at the time of bonding is as high as possible in a range of not exceeding the melting point of the solder bump. For example, in a case in which the melting point of the solder bump is 250° C., it is preferable to raise the temperature to a temperature range of 150° C. to 245° C. and preferably 190° C. to 240° C. It is more preferable as the time during which this temperature range is maintained is shorter from the viewpoint of throughput. The time may be set to 1 to 60 minutes, preferably 2 to 30 minutes, and more preferably 5 to 10 minutes. The above bonding can be performed in both of an air atmosphere and a vacuum atmosphere, but it is preferable to perform bonding in a vacuum of $1E^{-1}$ to $1E^{-5}$ Torr and preferably $1E^{-2}$ to $1E^{-4}$ Torr so that bubbles do not remain at the bonding interface.

Subsequently to bonding, the supporting substrate 15 which has been temporarily bonded is removed, and the device layer 13 is transferred to the transfer substrate 17 which is an insulator (FIG. 1(*g*)). The adhesive for temporary bonding 16 of TA1070T/TA2570V3/TA4070 manufactured by Shin-Etsu Chemical Co., Ltd. is provided with a layer capable of being easily peeled off by applying a mechanical force to the bonding surface. For this reason, the supporting substrate 15 can be removed by inserting a wedge at one end of the bonding surface, and the device layer 13 can be transferred.

Subsequently, the residue of the adhesive for temporary bonding 16 remaining on the surface of the device layer 13 is washed off (FIG. 1(*h*)). Since the adhesive for temporary bonding 16 swells in an organic solvent, for example, p-menthane, it is possible to easily remove the residue of the adhesive for temporary bonding 16 by immersing the transfer substrate 17 to which the device layer 13 has been transferred in p-menthane. The immersion time may be set to 1 to 10 minutes and preferably 3 to 5 minutes.

It is possible to obtain a substrate on which the device layer 13, the buried oxide film 12 layer, the adhesive for transfer 18, and the transfer substrate 17 of an insulator are stacked through the above steps. The buried oxide film 12 is defined by the buried oxide film thickness of the SOI wafer 14 on which the device is formed, and the thickness thereof is 50 to 500 nm. The thickness of the adhesive for transfer 18 is 0.1 to 5 μm, preferably 0.1 to 2 μm, and more preferably 0.1 to 1 μm. As the transfer substrate 17, it is possible to use a substrate having a thermal conductivity higher than the thermal conductivity of 40 W/m·K of a sapphire substrate to be used in silicon-on-sapphire, namely, sapphire, alumina, an AlN sintered body, a $Si_3N_4$ sintered body, a SiC sintered body, poly-SiC, polycrystalline diamond or the like. The substrate having this structure is obtained by the process of the manufacturing method described above with reference to FIGS. 1(*a*) to 1(*h*).

EXAMPLES

Example 1

As the device wafer (SOI wafer) 14 on which a device was formed, a wafer which had an external form of 200 mm φ and in which the thickness of the device layer 13 was 4 μm, the thickness of the buried oxide film 12 was 250 nm, and the thickness of the substrate (Si layer 11) was 725 μm was used. Solder bumps having a diameter of 80 μm were formed on the outermost surface of the device at a minimum pitch of 150 μm.

TA1070T/TA2570V3/TA4070 which was an adhesive manufactured by Shin-Etsu Chemical Co., Ltd. as an adhesive for temporary bonding 16 was laminated and applied on the surface (namely, the surface provided with the device layer 13) of this SOI wafer 14 by spin coating. First, TA1070 T as a device protecting layer was laminated by 10 μm, TA2570V3 as a layer to be a release surface of the supporting substrate 15 after processing was laminated by 7 µm, and TA4070 as an adhesive layer with the supporting substrate 15 was laminated by 90 µm. A Si wafer was used as the supporting substrate 15, and the adhesive for temporary bonding 16 and the Si substrate were held at 140° C. in a vacuum of $10^{-4}$ Torr while applying a load of 1 kgf/cm$^2$ thereto using a semi-automatic wafer bonder EVG 52015 manufactured by EV Group to be bonded to each other, and then the bonded body was treated in an oven at 190° C. for 2 hours to cure the adhesive for temporary bonding 16.

Next, the Si layer 11 on the back surface of the SOI wafer 14 was thinned to a thickness of 30 µm using a grindstone #2000 and a polisher and grinder PG300 manufactured by TOKYO SEIMITSU CO., LTD. Peeling off, cracking, and edge chips of the wafer were not observed although saw marks were observed on the surface after grinding.

Subsequently, edge trimming was performed by tape polishing using a wafer edge polishing machine NME-123N manufactured by MIPDX. The trimming width was set to from the outermost periphery of the wafer to the inside of 2 mm, and it was possible to perform trimming without causing cracking and peeling off.

Subsequently, the Si layer 11 which had a thickness of 30 µm and remained on the back surface side was removed by spin etching using an acid and a spin-etcher MSE2000 manufactured by Mimasu Semiconductor Industry Co., Ltd. The acid used was a mixed acid of $HF/HNO_3/H_3PO_4/H_2SO_4$, and the Si layer 11 had been completely removed in an etching time of 2 minutes to obtain a thinned device wafer.

Next, a $Si_3N_4$ sintered body substrate having an outer diameter of 200 mm φ, a thickness of 725 µm, a thermal conductivity of 100 W/m·K, and a resistivity of $5E+^{15}$ Ω·cm was used as the transfer substrate 17 which was an insulator. As the adhesive for transfer 18, TA4070 which was an epoxy-modified silicone adhesive and had a Young's modulus after curing was 240 MPa (measured by tensile vibration using DMS6100 manufactured by SII in conformity to JIS K 7244-1) was diluted with cyclopentanone to prepare a coating solution having an adhesive concentration of 0.5 wt %. This was applied to the $Si_3N_4$ wafer prepared as the transfer substrate 17 by spin-coating to form a layer of the adhesive for transfer 18 having a thickness of 1 µm with an in-plane dispersion of ±5%. The transfer substrate 17 coated with the adhesive for transfer 18 was baked at 150° C. for 5 minutes to perform solvent removal and half curing.

Subsequently, the thinned device wafer and the transfer substrate 17 were bonded to each other using a wafer bonder SB8 manufactured by SUSS MICROTEC SE. The $Si_3N_4$ substrate coated with the adhesive for transfer 18 and the thinned device wafer were superimposed one on the other at room temperature and bonded to each other by being held at 240° C. for 10 minutes in a vacuum of $1E^{-4}$ Torr while applying a load of 3 kgf/cm$^2$ thereto. Thereafter, the load was removed at a temperature of 60° C. or less, and the bonded wafer was taken out.

It was possible to transfer the device layer to the $Si_3N_4$ substrate by inserting a wedge to the temporary bonding interface of the bonded wafer and thus mechanically peeling off the Si wafer which was the supporting substrate 15. In terms of appearance, peeling off of the device layer 13 after being transferred was not observed. In addition, cracking of the pattern and peeling off of the solder bumps were not acknowledged when the in-plane device pattern was observed under an optical microscope.

The adhesive for temporary bonding 16 remaining on the surface was removed by immersing the $Si_3N_4$ substrate to which the device layer had been transferred in p-menthane for 5 minutes. Peeling off was not observed at the interface between the transferred device layer and the $Si_3N_4$ substrate, and the adhesive for transfer 18 was not eluted by p-menthane. Cracking of the pattern and deformation of the solder bumps were not acknowledged when the surface of the device after being cleaned was observed under an optical microscope. It was possible to transfer a device layer to a $Si_3N_4$ substrate in a state of maintaining the original device pattern shape in this manner.

Example 2

A device wafer (SOI wafer) on which the device layer 13 was formed and which was described in Example 1 was prepared and a temporarily bonded wafer from which the Si layer 11 on the back surface of the wafer had been completely removed was fabricated according to the same procedure as in Example 1. The $Si_3N_4$ substrate was also coated with the adhesive for transfer 18 according to the same procedure, and the load at the time of bonding was lowered to 1 kgf/cm$^2$.

The wafer was bonded. It was possible to transfer the device layer 13 to the $Si_3N_4$ substrate when the supporting substrate 15 was peeled off. Peeling off and deformation of the bumps were not observed when the device layer 13 after being cleaned was observed under an optical microscope.

Example 3

A device wafer on which the device layer 13 was formed and which was described in Example 1 was prepared and a temporarily bonded wafer from which the Si layer 11 on the back surface of the wafer had been completely removed was fabricated according to the same procedure as in Example 1. The $Si_3N_4$ substrate was also coated with the adhesive for transfer 18 according to the same procedure, and the load at the time of bonding was raised to 10 kgf/cm$^2$.

The wafer was bonded. It was possible to transfer the device layer 13 to the $Si_3N_4$ substrate when the supporting substrate 15 was peeled off. Peeling off and deformation of the bumps were not observed when the device layer 13 after being cleaned was observed under an optical microscope.

Example 4

A device wafer on which the device layer 13 was formed and which was described in Example 1 was prepared and a temporarily bonded wafer from which the Si layer 11 on the back surface of the wafer had been completely removed was fabricated according to the same procedure as in Example 1. The $Si_3N_4$ substrate was also coated with the adhesive for transfer 18 according to the same procedure, and the temperature at the time of bonding was lowered to 220° C.

The wafer was bonded. It was possible to transfer the device layer 13 to the $Si_3N_4$ substrate when the supporting substrate 15 was peeled off. Peeling off and deformation of the bumps were not observed when the device layer 13 after being cleaned was observed under an optical microscope.

Example 5

A device wafer on which the device layer 13 was formed and which was described in Example 1 was prepared and a temporarily bonded wafer from which the Si layer 11 on the back surface of the wafer had been completely removed was fabricated according to the same procedure as in Example 1. In the coating of the $Si_3N_4$ substrate with the adhesive for transfer 18, a coating solution having an adhesive concentration of 0.05 wt % was prepared and the layer thickness of the adhesive for transfer 18 after being applied was set to 0.1 µm. Subsequently, bonding was performed according to the same procedure as in Example 1.

The wafer was bonded. The device layer 13 except the region in 10 mm from the outer periphery was transferred when the supporting substrate 15 was peeled off. It has been found that it is required to provide the adhesive for transfer 18 in a thickness of at least 0.1 µm or more for transfer of the entire surface from the fact that most part of the device layer 13 was transferred.

Example 6

A device wafer on which the device layer 13 was formed and which was described in Example 1 was prepared and a temporarily bonded wafer from which the Si layer 11 on the back surface of the wafer had been completely removed was fabricated according to the same procedure as in Example 1. In the coating of the $Si_3N_4$ substrate with the adhesive for transfer 18, the concentration of the coating solution was set to 15 wt % so that the thickness of the adhesive became 6 µm and the other operations were performed according to the same procedure. The temperature at the time of bonding was set to 120° C. to be lower than that in Example 4. At this stage, the substrates were superimposed one on the other, but full cure was performed by heating the substrates at 220° C. in a state of applying a load of 3 kgf/cm² thereto.

The wafer was bonded. It was possible to transfer the device layer 13 to the $Si_3N_4$ substrate when the supporting substrate 15 was peeled off. Peeling off and deformation of the bumps were not observed when the device layer 13 after being cleaned was observed under an optical microscope.

Comparative Example 1

A device wafer on which the device layer 13 was formed and which was described in Example 1 was prepared and a temporarily bonded wafer from which the Si layer 11 on the back surface of the wafer had been completely removed was fabricated according to the same procedure as in Example 1.

In order to smooth the surface of the $Si_3N_4$ substrate to be bonded, a SiN layer was formed by 0.6 µm by LPCVD and CMP was performed, thereby fabricating a smooth substrate having Rms of 0.2 nm.

It was attempted to bond the surface of the temporarily bonded wafer and the $Si_3N_4$ substrate to each other without using the adhesive for transfer 18, but it was impossible to bond these to each other even when a load of 20 kgf/cm² was applied thereto.

A stripe-shaped level difference having a height of 10 nm was generated at a period of 14 µm when the surface on the device wafer side was examined under AFM (atomic force microscope). A device wiring pattern was confirmed at the same period when the same observation site as the above was observed under an optical microscope. It has been found that a level difference due to the wiring pattern was generated in a state in which the Si layer 11 had been completely removed and it is difficult to bond the members to each other by means which does not use an inclusion such as plasma bonding and direct bonding.

Comparative Example 2

A device wafer on which the device layer 13 was formed and which was described in Example 1 was prepared and a temporarily bonded wafer from which the Si layer 11 on the back surface of the wafer had been completely removed was fabricated according to the same procedure as in Example 1.

The adhesive for transfer 18 was applied not to the $Si_3N_4$ substrate but to the thinned device wafer side according to the same procedure as in Example 1. Creases were formed on the thinned device wafer and peeling off from the supporting substrate 15 occurred when the adhesive for transfer 18 was applied by spin coating and baked at 150° C. It is considered that it is impossible to suppress deformation of the adhesive for temporary bonding 16 due to heat but creases are formed in a state in which bonding is not achieved and the thickness of the device wafer is thin. Consequently, it has been found that it is impossible to provide the adhesive for transfer 18 on the device wafer side but it is required to provide the adhesive for transfer 18 on the transfer substrate 17 side.

Comparative Example 3

Temporary bonding with the supporting substrate 15 was performed using WSS manufactured by 3M as the adhesive for temporary bonding 16. WSS is an acrylic UV curable adhesive and has a structure provided with a layer which peels off by being irradiated with YAG laser. For this reason, the supporting substrate 15 is required to be transparent in UV to near-infrared, and Tempax substrate was used as a supporting substrate here.

The back surface was ground, edge trimming was performed, and etching using an acid was performed according to the same procedures as in Example 1. The outer peripheral portion of the device wafer after being trimmed peeled off and creases were generated toward the center of the substrate. This is because the ultraviolet absorbing layer used in WSS was eroded by an acid and peeled off from the supporting substrate 15. Since erosion by an acid was confirmed, spin etching was attempted at 70° C. using 50% KOH which was an alkali but peeling off occurred at the peripheral portion of the device wafer during the etching. In the case of WSS, it was impossible to completely remove the Si layer 11 on the back surface of the wafer in a state in which the bonding between the device wafer and the supporting substrate 15 was maintained.

Comparative Example 4

A device wafer on which the device layer 13 was formed and which was described in Example 1 was prepared, the operations to grinding of the back surface of the wafer were performed according to the same procedure as in Example 1, and edge trimming using a grinder was attempted.

However, grinding did not proceed any more in the middle of edge trimming, the outer peripheral end of the device wafer seized, and peeling off from the supporting substrate 15 occurred. It has been found that the adhesive for temporary bonding 16 used exhibits favorable resistance to an acid and an alkali but causes clogging of the grindstones and thus processing does not proceed. Consequently, it has been found that it is suitable to perform trimming by tape polishing in order to perform edge trimming using the adhesive for temporary bonding 16.

Comparative Example 5

A device wafer on which the device layer 13 was formed and which was described in Example 1 was prepared and a temporarily bonded wafer from which the Si layer 11 on the back surface of the wafer had been completely removed was fabricated according to the same procedure as in Example 1. The $Si_3N_4$ substrate was also coated with the adhesive for transfer 18 according to the same procedure, and the atmosphere in the bonding was set to an air atmosphere but not a vacuum atmosphere.

The wafer obtained was bonded, but a situation in which a part of the device layer 13 floated from the $Si_3N_4$ substrate was observed when the supporting substrate 15 was peeled off. The residual finish of the adhesive for temporary bonding 16 on the outermost surface was eliminated when the outermost surface was cleaned, and thus the floating region of the device layer 13 peeled off.

It is considered that bubbles remain at the bonding interface and this part is not bonded or the bonding force is insufficient in bonding in an air atmosphere. Consequently, it has been found that it is preferable to perform bonding in a vacuum atmosphere in order to perform transfer uniformly in the plane.

Comparative Example 6

A device wafer on which the device layer 13 was formed and which was described in Example 1 was prepared and a temporarily bonded wafer from which the Si layer 11 on the back surface of the wafer had been completely removed was fabricated according to the same procedure as in Example 1. The $Si_3N_4$ substrate was also coated with the adhesive for transfer 18 according to the same procedure, and the load at the time of bonding was raised to 20 $kgf/cm^2$.

The wafer was bonded, and it was possible to transfer a device layer to a $Si_3N_4$ substrate by peeling off the supporting substrate 15. However, when the device layer after being cleaned was observed under an optical microscope, the solder bumps were deformed and a portion connected to the adjacent bump was also acknowledged although peeling off of the device layer was not observed. Consequently, it has been found that there is an upper limit to the load at the time of bonding in order to prevent deformation of the solder bump.

The results for Examples and Comparative Examples described above are presented in the following Table 1.

TABLE 1

| | Temporary adhesive material | Trimming | Adhesive layer configuration Coated surface | Thickness | Bonding conditions Atmosphere | Temperature | Load | Results |
|---|---|---|---|---|---|---|---|---|
| Example1 | Thermosetting silicone | Tape polishing | Transfer substrate side | 1 μm | Vacuum | 240° C. | 3 $kgf/cm^2$ | Transfer to entire surface, without deformation |
| Example2 | Same as above | Same as above | Same as above | Same as above | Same as above | Same as above | 3 $kgf/cm^2$ | Same as above |
| Example3 | Same as above | Same as above | Same as above | Same as above | Same as above | Same as above | 10 $kgf/cm^2$ | Same as above |
| Example4 | Same as above | Same as above | Same as above | Same as above | Same as above | 220° C. | 3 $kgf/cm^2$ | Same as above |
| Example5 | Same as above | Same as above | Same as above | 0.1 μm | Same as above | 240° C. | Same as above | Transfer except 10 mm from outer periphery, without deformation |
| Example6 | Same as above | Same as above | Same as above | 6 μm | Same as above | 120° C.-220° C. | Same as above | Transfer to entire surface, without deformation |
| Comparative Example 1 | Same as above | Same as above | | | Air | Room temperature | 0~20 $kgf/cm^2$ | Not bonded |
| Comparative Example2 | Same as above | Same as above | Device wafer side | Same as above | | | | Generation of creases on device wafer side |
| Comparative Example3 | UV curable acrylic polymer | Same as above | | | | | | Peeling off at time of etching |
| Comparative Example4 | Thermosetting silicone | Grinder | | | | | | Peeling off at time of trimming |
| Comparative Example5 | Same as above | Tape polishing | Transfer substrate side | 1 μm | Air | 240° C. | 3 $kgf/cm^2$ | Partial peeling off after transfer |
| Comparative Example6 | Same as above | Same as above | Same as above | Same as above | Vacuum | 240° C. | 20 $kgf/cm^2$ | Transfer to entire surface, deformation of solder bump |

It has been found that it is difficult to remove the Si layer 11 on the back surface of the wafer unless an acid resistant one is used as the adhesive for temporary bonding to be used. It has been found that it is essential to perform edge trimming by tape polishing and to apply the adhesive for transfer 18 on the side of the transfer substrate 17 of an insulator in order to prevent peeling off of the device wafer from the supporting substrate 15 at the time of processing and bonding. In addition, it has been found that there are optimum ranges for the thickness of the layer of the adhesive for transfer 18, the bonding atmosphere, and the load at the time of bonding in order to uniformly perform transfer on the entire surface without bump deformation.

The substrate configuration to be obtained is device layer/buried oxide film layer/adhesive for transfer/insulator, in which the thickness of the buried oxide film is 50 to 500 nm and the thickness of the adhesive for transfer 18 is 0.1 to 10 µm, preferably 0.1 to 2 µm, and more preferably 0.1 to 1 µm, and a highly thermal conductive insulator substrate on which a device layer exhibiting high heat dissipation property is mounted can be realized.

It should be noted that the present embodiments have been described above but the present invention is not limited to these examples. For example, those obtained by appropriately subjecting the above-described respective embodiments to addition, deletion, and design change of the constituent elements and those obtained by appropriately combining the features of the respective embodiments by those skilled in the art are also included in the scope of the present invention as long as the gist of the present invention is equipped.

REFERENCE SIGNS LIST

11 Silicon layer
12 Buried oxide film
13 Device layer
14 SOI wafer
15 Supporting substrate
16 Adhesive for temporary bonding
17 Transfer substrate
18 Adhesive for transfer

The invention claimed is:

1. A thermal conductive substrate, which is a substrate formed by bonding a device layer formed on a silicon on insulator (SOI) wafer and a buried oxide film to an insulator substrate having a thermal conductivity of 40 W/m·K or more via an adhesive having a Young's modulus after curing of 10 MPa to 2 GPa, wherein a thickness of the buried oxide film is 50 to 500 nm and a thickness of the adhesive is 0.1 µm to 10 µm; and wherein the adhesive is a thermosetting epoxy-modified silicone.

2. The thermal conductive substrate according to claim 1, wherein the insulator substrate is selected from sapphire, alumina, an AlN sintered body, a $Si_3N_4$ sintered body, a SiC sintered body, poly-SiC, or polycrystalline diamond.

* * * * *